United States Patent
Luk et al.

(10) Patent No.: US 7,099,216 B2
(45) Date of Patent: Aug. 29, 2006

(54) SINGLE CYCLE READ/WRITE/WRITEBACK PIPELINE, FULL-WORDLINE I/O DRAM ARCHITECTURE WITH ENHANCED WRITE AND SINGLE ENDED SENSING

(75) Inventors: Wing K. Luk, Chappagua, NY (US); Robert H. Dennard, Croton On Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 151 days.

(21) Appl. No.: 10/656,596

(22) Filed: Sep. 5, 2003

(65) Prior Publication Data

US 2005/0052897 A1    Mar. 10, 2005

(51) Int. Cl.
*G11C 7/00*    (2006.01)

(52) U.S. Cl. ........................ 365/205; 365/149; 365/207
(58) Field of Classification Search ................ 365/149, 365/205, 207, 230.03
See application file for complete search history.

(56) References Cited

U.S. PATENT DOCUMENTS

| | | | | |
|---|---|---|---|---|
| 6,014,338 A | * | 1/2000 | Wang et al. | 365/205 |
| 6,075,735 A | * | 6/2000 | Sugibayashi | 365/206 |
| 6,108,258 A | * | 8/2000 | Chen et al. | 365/208 |
| 6,246,622 B1 | * | 6/2001 | Sugibayashi | 365/210 |
| 6,351,419 B1 | * | 2/2002 | Dietrich et al. | 365/189.04 |
| 6,480,424 B1 | * | 11/2002 | Issa | 365/189.02 |
| 6,552,944 B1 | | 4/2003 | Fifield | 365/208 |
| 6,768,692 B1 | * | 7/2004 | Luk et al. | 365/205 |
| 2005/0030817 A1 | * | 2/2005 | Luk et al. | 365/226 |

* cited by examiner

*Primary Examiner*—Huan Hoang
(74) *Attorney, Agent, or Firm*—George Sai-Halasz

(57) ABSTRACT

A DRAM is disclosed which includes a single ended bitline structure, a single ended global bitline structure, primary sense amplifiers with data storage and data write-back capability and with capability to decouple from the global bitlines, a full-wordline I/O structure where essentially all memory cell that belong to the same wordline are being operated on, and a pipelined architecture. The DRAM further includes a small voltage swing design. The primary sense amplifiers can include more than one amplification stages. Such a DRAM is suitable for applications in conjunction with processors as an embedded DRAM.

8 Claims, 7 Drawing Sheets

SINGLE CYCLE READ/WRITE/WRITEBACK PIPELINE, FULL-WORDLINE I/O DRAM ARCHITECTURE WITH ENHANCED WRITE AND SINGLE ENDED SENSING

FIELD OF THE INVENTION

The present invention relates to DRAM memories that have high data throughput rates and speed. In particular, exemplary embodiments of this invention deal with embedded DRAM macros of novel architecture.

BACKGROUND OF THE INVENTION

Today's integrated circuits include a vast number of transistor devices formed in a semiconductor. Smaller devices are the key to enhance performance and to increase reliability. As devices are scaled down, however, the technology becomes more complex and new methods are needed to maintain the expected performance enhancement from one generation of devices to the next. The storage capacity, speed, and data throughput rates of memories has to keep up with processor improvements.

SUMMARY OF THE INVENTION

DRAM memories traditionally lead in storage density but typically they are not the state of the art in speed and bandwidth. Modern high performance processors need both a large amount of data and rapid access to it. The latter means high speed and bandwidth. This is particularly true with so called embedded DRAM macros (EDRAM).

Such macros comprise part of the processor chips and speed is especially of high premium.

In view of such needs the present invention discloses a DRAM architecture with a single cycle Read/Write/WriteBack (R/W/Wb) pipeline, and with full-wordline I/O per Read/Write operation. Read/Write/WriteBack operation can be performed in a single clock cycle in different banks of the macro(s).

It is a further object to teach this DRAM architecture incorporating a full-wordline I/O structure for Read/Write/ WriteBack with small global bitline signal swing, resulting in low active power and low noise coupling during Read/ Write operation.

It is also part of the teaching in exemplary embodiments of this invention an enhanced Write/WriteBack circuit structure at the primary sense amplifier (PSA). Such circuit allows the use of long global bitline (hence larger macro with higher density) operating with small voltage swing (lower power and noise coupling), since the degraded Write signal due to long global bitline resistance R and capacitance C is regenerated and amplified by the enhanced Write/ WriteBack circuit before writing to the DRAM cell.

It is a further object in exemplary embodiments the present invention to provide for a global bitline to be available in every cycle for Read/Write to the different banks, while WriteBack is taking place at yet another different bank at the same time. This is handled by a special "cut-off" device in the PSA which decouples the global bitline from the WriteBack circuit. After a Read cycle, the WriteBack is performed at the local PSA decoupled from the global bitline. The global bitlines are available for Read/ Write at a different bank every cycle (while WriteBack is taken place). The decoupling of global bitline from local sense amplifier during WriteBack is key to the performance delivered by the single cycle Read/Write architecture.

An exemplary embodiment of the invention further teaches how the single ended bitline and single ended global bitline structure and the PSA with local WriteBack enable the Read/Write/WriteBack of the bits associated with an entire wordline to the I/O located at the edge of the DRAM macro, or back to the DRAM cells (full-wordline I/O structure).

It is a further object in exemplary embodiments the invention to teach a new, area efficient PSA which comprise at least two amplification stages, high gain, single ended sensing buffers, feedback circuit for enhanced WriteBack/ Write operations and the global bitline isolation "cut-off" device. The Read/Write/WriteBack operations and their controls can be combined area-efficiently in a PSA circuit which can have as few as 6 FET devices. There can be one more NFET per bitline for bitline multiplexing. The two stage buffer arrangement enables the first stage to amplifier a small bitline signal (e.g. 200 mV) to almost fill Vdd swing (e.g. 1V) to drive the second stage which has enough gate overdrive to handle a long, heavily capacitance loaded global bitline. Such structure results in small sense amplifier PET devices that can drive a long global bitline (GBL) spanning a typical chip (e.g. 10 mm).

An exemplary embodiment of the invention also teaches a two amplification stage secondary sense amplifier (SSA) to detect potentially small GBL signals.

Exemplary embodiments of the present invention also teach a linearly growable bank structure with single ended bitline and global bitline which allows each DRAM array (same as bank) to be placed in a linear (vertical) direction on top of each other. In this manner all the bits associated with an entire wordline can be read or written to the secondary sense amplifier, and ten to the I/O located at the edge of the macro. The global bitlines run over the banks linearly for the Read/Write and I/O operations.

A further embodiment of the present invention teaches a two dimensional growable structure by combining macros to form a bigger DRAM, or EDRAM, with shared input, output, command and address buses running in orthogonal direction to the macros. The command, address and data can be distributed to the macros, and data returned to the overall I/O with minimum skew. The floorplan is growable in two dimensions, vertically within a macro in term of the number of arrays, and horizontally in terms of the number of macros. The overall structure can be used to increase overall I/O width and/or to increase number of banks. The overall structure can perform simultaneous Read/Write in the same cycle at different banks located in non-overlapping macros. WriteBack and Read/Write can be performed in the same macro within the same cycle.

BRIEF DESCRIPTION OF THE DRAWINGS

These and other features of the present invention will become apparent from the accompanying detailed description and drawings, wherein.

Figure 2:
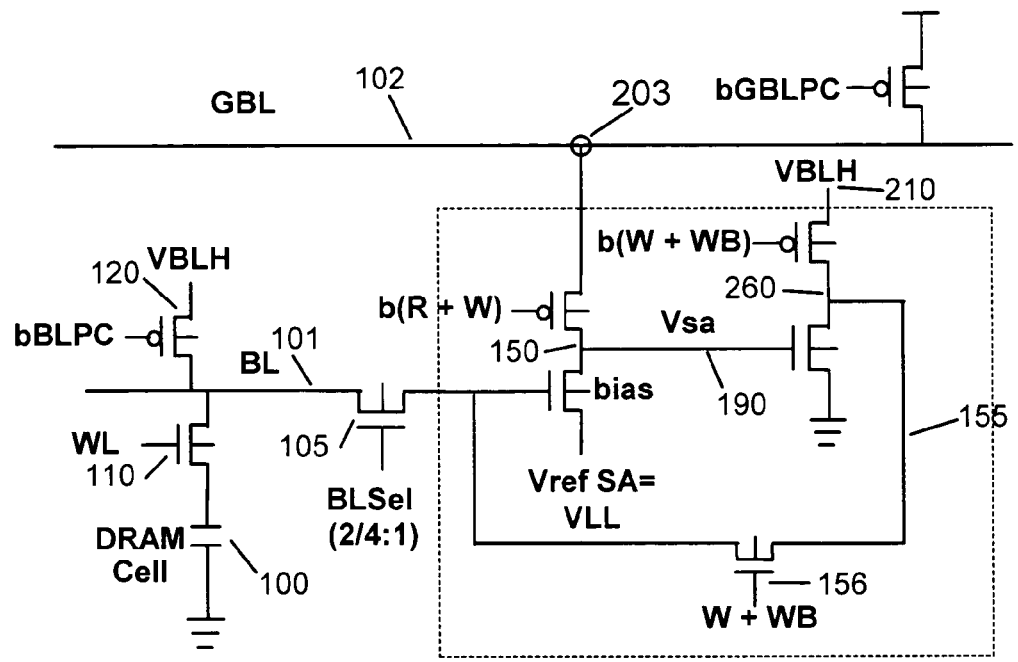
Figure 3:
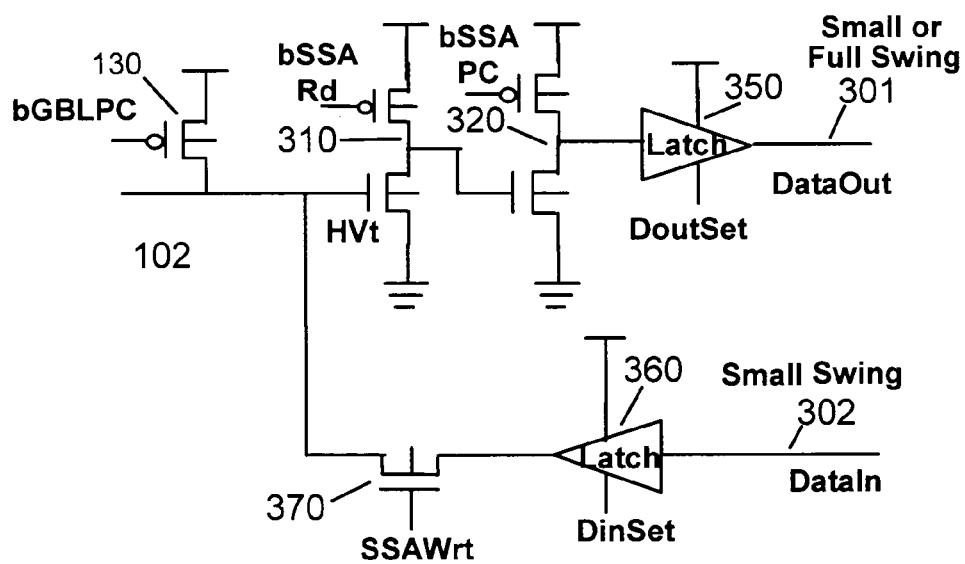
Figure 4:
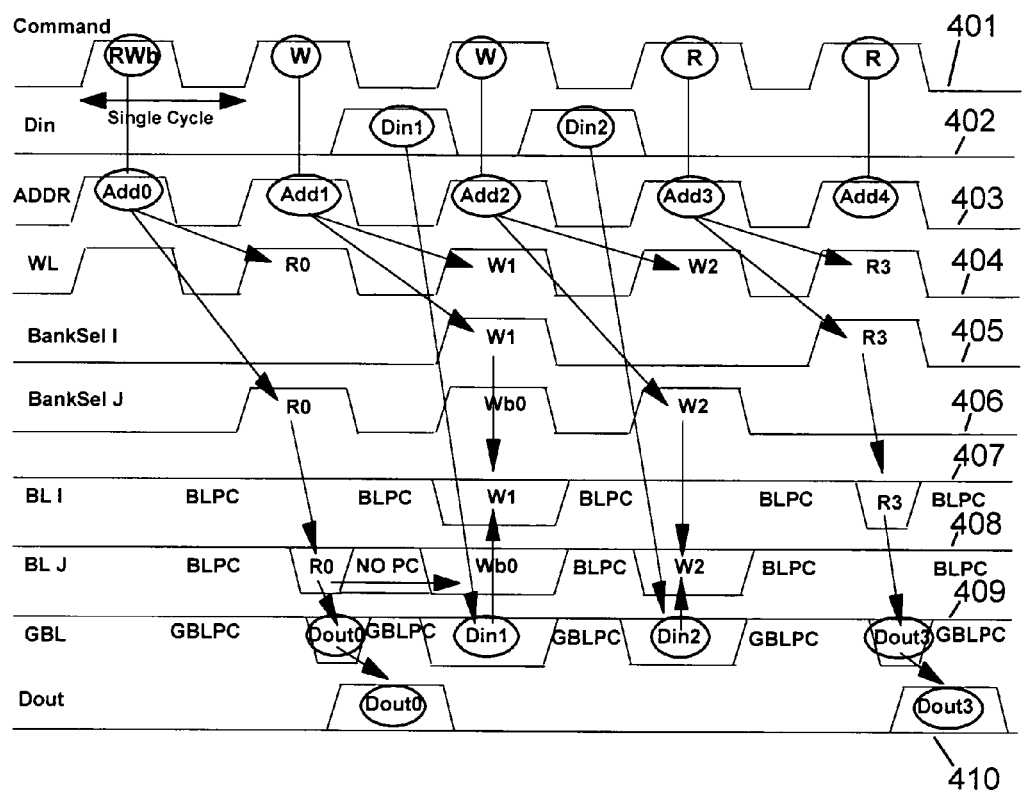
Figure 7:
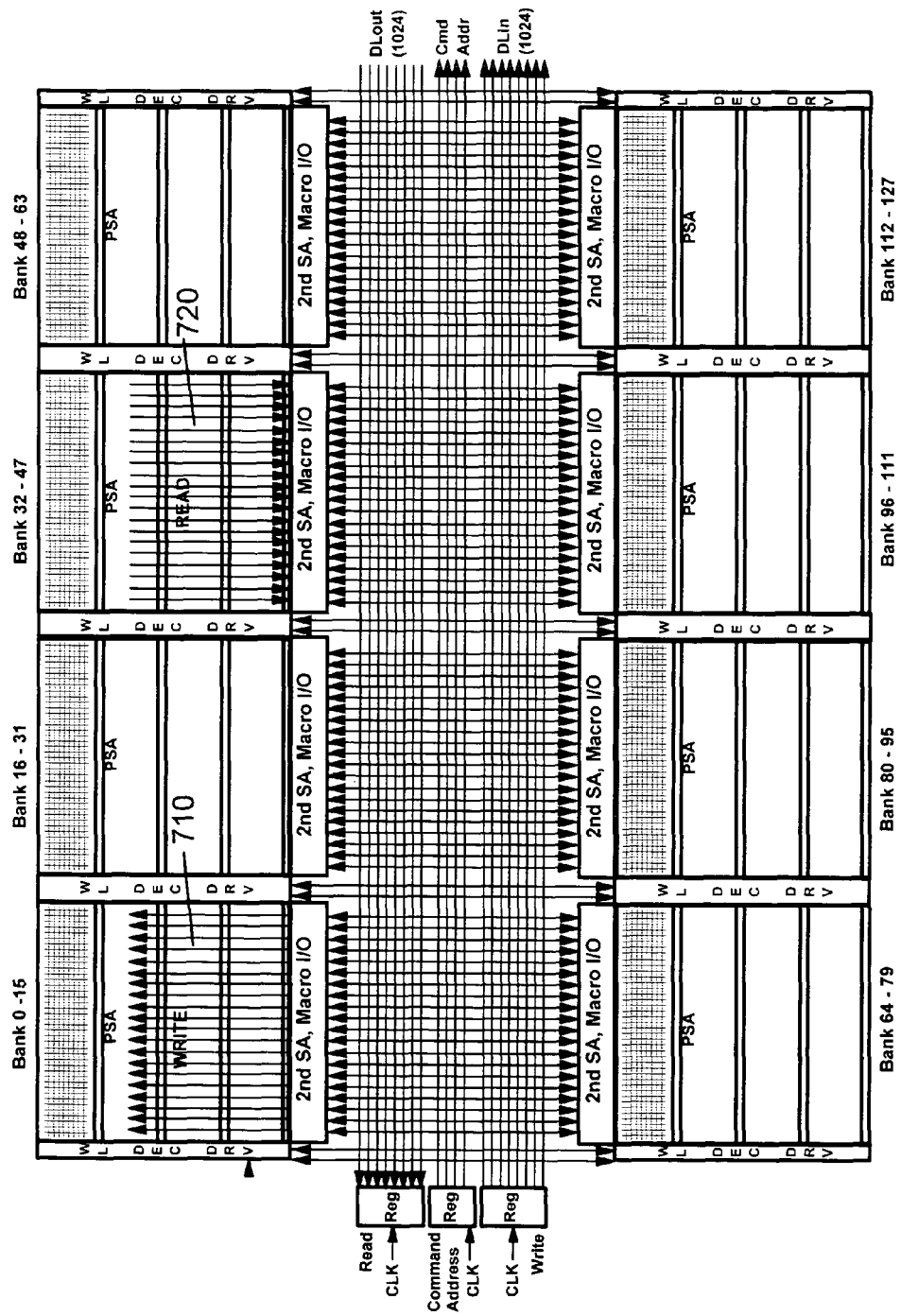

1A, with grounded first stage amplifier, and feedback device controlled by the output of first stage amplifier;

1B, with source reference bias first stage amplifier, and feedback device controlled by the write-back control signal;

1C, shows a ground sensing scheme, essentially a complementary version of the primary sense amplifier in 1A;

FIG. 2 shows an exemplary embodiment of a DRAM primary sense amplifier with data storage and data write-back capability;

FIG. 3 shows an exemplary embodiment of a DRAM secondary sense amplifier with two amplification stages;

FIG. 4 shows examples of executed operation and timing of the pipelined architecture DRAM;

FIG. 5 shows waveform examples on various nodes of the pipelined architecture DRAM;

5A, shows a Read command and a WriteBack command as executed in The same cycle;

5B, shows a Read command and a WriteBack command as executed in differing cycles;

FIG. 6 shows exemplary embodiments of various modular DRAM size increases;

6A, illustrates a modular increase of I/O size:

6B, illustrates a modular increase of banking size, and combination of banking size and I/O size increase; and FIG. 7. shows an exemplary floorplan of a two dimensional growable Read/Write/WriteBack DRAM.

DETAILED DESCRIPTION OF THE INVENTION

FIG. 1 shows exemplary embodiments of DRAM primary sense amplifiers with data storage and data write-back capability, and two amplification stages. The DRAM memory cell capacitor 100 is connected to a single ended bitline 101 under the control of the wordline (WL) 110 of the transfer device. The single ended bitline 101 exemplifies the embodiment of a single ended bitline structure, where the storage cell connects to the primary sense amplifier (PSA) by only one single bitline. In FIG. 1 the PSA is made up the circuits enclosed in the dashed rectangle. The bitline 101 access to the PSA is controlled by a multiplexer device 105. In an exemplary embodiment the PSA-s are located between two adjacent DRAM arrays, and each PSA is shared between four bitlines by using multiplexers 105. The four bitlines are: two bitlines (odd and even) from the upper array and two bitlines (odd and even) from the lower array, since one array (bank) is active, and only either an odd or an even bitline is selected at a given cycle. This arrangement of sharing primary sense amplifiers between two adjacent arrays results in smaller area, but the limitation is that the adjacent array cannot be active for Read or Write while the adjacent counterpart is under WriteBack operation after a Read (other banks besides these two can perform Read or Write during WriteBack). In an alternate embodiment only two adjacent bitlines from the same array share the PSA, eliminating the said limitation and enabling simultaneous Read or Write in one array and WriteBack in another adjacent array, hence the multiplexing typically is 2 or 4 to 1 (2/4:1). Accordingly there is a 2 or 4 to 1 association between the cells and the PSAs.

The multiplexer device 105 is not an integral part of the PSA. In some exemplary embodiments it can be completely omitted. In such a case there is a 1 to 1 association between cells and a PSAs.

The least two amplification stages of the PSA are circuits 150 and 160. The first stage 150 amplifies the signal arriving from the cell 100 through the single ended bitline 101. The output of stage 150, Vsa 190 inputs into the second stage 160. The second circuit 160 is connected to the global bit line (GBL) 102 at the PSA GBL connection 103. A feedback connection 155 assures that the 2 stages 150 and 160 form a latch, which has information storage capability. The connection 155 is also connected to the bitline 101 whereby giving the PSA a write-back capability. Several devices receive on their gates command, or control signals. The voltage is high at these input points when the statement is true. For instance, on the NFET device 156 the gate receives the W+WB control signal. This notation means that the voltage is high during a Write (W) or a WriteBack (WB) operation. The letter "b" on front of any expression means the compliment of the expression. For instance, the PFET device of circuit 160 takes the b(R+W) control signal. Accordingly, this control line is low during Read (R) or Write (W) operations. The following further control signal notations are used in FIGS. 1A, 1B, and 1C. BLPC stands for bitline precharge, WL stands for wordline, GBLPC stands for global bitline precharge, BLSel stand for bitline select, Rs and Ws stand for Read and Write operations which does not involve global input/output, such as a refresh operation which is a Read followed by WriteBack.

The DRAM with the PSA embodiments shown on FIG. 1 can have a small voltage swing design. Small voltage swing design saves power and reduces noise coupling, while sacrificing little in speed. Such a low voltage design is disclosed in U.S. Patent application by W. K. Luk et al, titled: "Low Power Circuits with Small Voltage Swing Transmission, Voltage Regeneration, and Wide Bandwidth Architecture", filed on Aug. 6, 2003, tentative Ser. No. 10/635,331, incorporated herein by reference. The relevant voltages for the PSA are VBLH standing for bitline high voltage, Vref SA standing for sense amplifier source reference voltage. Accordingly, the bitline is precharged to VBLH by device 120.

The single ended global bitline 102 (GBL), to which the PSA connects 103, exemplifies the embodiment of a single ended global bitline structure. The GBL is precharged high to VDD by device 130, but in the small voltage swing design embodiment its low is VLL. The smaller GBL swing is achieved by using a PFET in the second stage 160 of the PSA, it limits the downward voltage swing of the GBL to about VDD-VtPFET (about 0.5 V) instead of to GND.

The PFET device (NFET for the circuit on FIG. 1C) of the PSA second stage 160 is being capable to decouple the PSA from the GBL. When either Read or Write command signals are low the GBL becomes electrically isolated, or "cut off" from the PSA. In such cases the GBL is available for serving other functions or operations on other parts of the DRAM.

Due to the single ended bitline and the single ended global bitline architecture, and to the reduced voltage swing design, as well, the thresholds of the MOS devices in the PSA are customized. (MOS device stand metal oxide semiconductor device a name with historic connotations. MOS devices typically come is two varieties NFET and PFET. In many of today's circuits the NFET and PFET devices are combined into CMOS configurations.) They are different than those pertaining to a given technology level, which are determined by the requirements of keeping subthreshold leakage low, while giving sufficient overdrive for carrying large currents. For the sake of proper operation of the PSA some of the device thresholds deviate from the device thresholds pertaining to the technology that they are part of. Their custom value is derived from the relative positions of the high and low values of the various power rail voltage differentials, and the range of input voltages received. In an exemplary embodiment of the invention the threshold voltages can be dynamically adjusted by biasing the well from a feedback circuit which monitors voltage, temperature, and process (VTP) variations. Dynamic adjustment of device thresholds with well biasing is known by those ordinarily skilled in the art. For instance U.S. patent application Ser. No. 09/917,059 filed Jul. 17, 2001 incorporated herein by reference, and U.S. Pat. No. 6,518,827 entitled: "Sense Amplifier Threshold Compensation" to J. Fifield et al, incorporated herein by reference, teaches such a device threshold dynamic adjustment. Alternatively, the MOS devices can be fabricated with the desired threshold values.

A key feature of the PSA is the local Write and WriteBack circuit. The NFET 156 (W+WB) forms the feedback from the second stage 160 output to the bitline 101 for WriteBack operation after a Read operation, it is controlled by the WriteBack control signal WB. The NFET 156 is also used for the path to write to the DRAM cell from the GBL, when the Write control signal W is high.

The local enhanced Write and WriteBack circuit structure at the PSA allows the use of long GBL (hence larger, higher density embedded DRAM macro) operating with smaller voltage swing (lower power and noise coupling), since the degradation of Write signal due to long GBL R and C is regenerated and amplified at the PSA before writing to the DRAM cell.

In order to WriteBack after a Read operation, the bitline 101 is not reset or precharged after a Read for Read/WriteBack command. The same wordline is activated during the WriteBack cycle. After a Read, the PFET (b(R+W)) at the second stage 160 of the PSA is turned off, decoupling the PSA from the GBL, so the GBL is free for any Read/Write operation for other banks. The output of the second stage 160 of the PSA is feedback to the bitline via the NFET (W+WB) 156, the Read state (high for read 0 data, 0 for read 1 data) is held at the node/line Vsa 190 for the next cycle to write back to the DRAM cell 100. As in the case for Write, the WriteBack of a 0 is enhanced by the voltage Vsa being high and the bitline is held to GND by the NFET in the second stage 160 of the PSA. The bitline may or may not be reset, since the node/line Vsa 190 already holds the last read state. By not resetting the bitline 101 would save some power and would avoid the extra bitline swing due to resetting. The WriteBack control signal WB can be set right before the Read control signal R disabled, the timing is not very crucial, even WB is set a little bit later after R disabled.

For a representative embodiment the various voltages can be found in TABLE 1, and in the following discussion for data 0 and 1, for Read and Write, on the bitline and other nodes of the circuit. It also shows the design parameter, the source reference voltage (Vref SA), and the NFET threshold (VtSA) of the first stage sense amplifier 150. The term "wc" stands for worst case.

TABLE 1

VBLH = 1 V, VDD = 1.1 V, VLL = 0.5 V
Cell transfer ratio: BL 128 = 1/3, BL 256 = 1/5

|  | VBL | Vsa | VGBL |
|---|---|---|---|
| Read 0 (wc): | 0.75 V (BL 128) | 0.95 V | 0.5 V |
|  | 0.88 V (BL 256) | 0.75 V | 0.5 V |
| Read 1 (wc): | 1 V (BL 128) | 0.20 V | 1.1 V |
|  | 1 V (BL 256) | 0.35 V | 1.1 V |
| Write 0: | 0 V | 1 V | 0.5 V |
| Write 1: | 1 V | 0.2 V | 1.1 V |

VBL(read1) > Vref SA + VtSA >= VBL(read0)
Vref SA = 0.2 V, SAVt = 0.6 V (HVt NFET) or
Vref SA = 0 V, bias = −0.5 V st VtSA~0.8 V The PSA is made up of a two stage, single ended sensing buffers 150 and 160. The bitline is precharged to VBLH=1V by a PFET 120. The DRAM cell stores 0V or 1V respectively for data 0 or 1. To read the DRAM cell, the wordline 110 controlled FET is turned ON and the DRAM cell charge is transferred to the bitline resulting in a voltage difference between a stored 0 or a stored 1 in the cell. The signal difference is detected by the two stage PSA accordingly and appears as a larger signal on the global bitline 102 and passes to the global secondary sense amplifier located at the far end of the macro.

The input and output of the PSA is connected to a bidirectional, single ended GBL 102, that runs end to end through the DRAM macro. The GBL connects to the PSA of each array for Read/Write operation of the bits on the entire wordline and transfer the data to/from the global secondary sense amplifier at the end (bottom) of the macro for I/O.

The first stage 150 NFET can either be well biased to about 0.8 V threshold (VtSA) or use a high Vt NFET device of 0.6 V threshold with a source reference voltage of 0.2 V (Vref SA), assuming the Read 0 bitline voltage of 0.8 V and the Read 1 bitline voltage of 1 V. The bitline Read 0 and Read 1 voltage depend on he DRAM cell capacitance and the bitline capacitance transfer ratio.

As shown in TABLE 1 and FIG. 1, for a bitline length of 128 bits, the first stage 150 amplifies the small DRAM cell signal difference of 0.25 V (0.75 V and 1 V between reading 0 or 1), to an intermediate voltage difference of 0.95 V and 0.2 V at the node Vsa (output of first stage 150, input to second stage 160). The larger voltage difference provides enough gate overdrive (Vgs−Vth) to drive the second stage whose output 103 drives the global bitline GBL 102. The two stage sensing amplifier is key to handle a long, heavily loaded GBL for large, high density, bank-growable DRAM macro. For a longer bitline length of 256 bits (bigger array), the worst case signal is a smaller 0.12 V (0.88 V and 1 V between reading 0 and 1), and the intermediate voltage difference of 0.75 V and 0.35 V for Vsa. Due to the first stage amplification, the PSA is able to sense both cases, whereas the single stage version might not be able to handle the long bitline case due to a smaller bitline signal.

For a bitline length of 256 bit, the first stage of the PSA 150 amplifies the small signal of 0.12 V (worst case) to 0.4 V (0.75 V−0.35 V), gives a significant gain which is crucial for the second stage 160 to drive the long GBL 102, producing a output of 0.5 V, between VLL and VDD (e.g. 0.5 V−1.1 V). The threshold of the first stage 150 NFET is chosen, or set by a combination of Vref SA (source voltage) and bias (well bias), such that it is at the worst case low voltage (highest Read 0) of the input gate voltage. The width of the NFET and PFET (Wpfet/Wnfet) devices of the first stage 150 are adjusted such that the output of the first stage is maximally span and flip point of the second stage is at about the mid-point. The width optimization is important for the overall gain and process variation tolerance. This would give the maximum gain. The output swing of VLL and VDD (e.g. 0.5 V−1.1 V) is intended for low power design, a lower threshold or zero Vt PFET for the second stage 160 would be able to produce a larger output voltage swing (if needed). The first stage 150 PFET can be of low Vt for smaller area, or high Vt (with larger area) for smaller standby current due to the large number of PSA used in DRAM. In either case, its width Wpfet can be adjusted for maximum gain and process stability.

TABLE 2

|  | 0 data | 1 data | del V | |
|---|---|---|---|---|
| Cell | 0–0.4 V | 0.6–1.0 V | 0.2 V | 1.0 V |
| Bitline (PSA input) | 0.8–0.88 V | 0.92–1.0 V | 0.04 V | 0.2 V |
| First Stage Output | 0.86–0.75 V | 0.55–0.34 V | 0.2 V | 0.52 V |
| Second Stage Output | 0.5 V–0.6 V | 1.1–1.1 V | 0.5 V | 0.6 V |
| First Stage | Vt_pfet/Vt_nfet | | 0.7 V/0.8 V | |
|  | Wpfet/Wnfet | | 700 nm/400 nm | |

TABLE 2-continued

| Second Stage | Vt_pfet/Vt_nfet | 0.3 V/0.3 V |
| | Wpfet/Wnfet | 8 um/3 um |

| PSA Gain | |
| --- | --- |
| Stage1 | 0.20/0.04 = 5 |
| Stage1 (av) | 0.52/0.20 = 2.6 |
| Two stage | 0.50/0.04 = 12.5 |
| Two stage (av) | 0.60/0.20 = 3 |

In a representative embodiment the two stage PSA characteristic, its best-case and worst-case operating points and its margin for signal tolerance and noise are shown in TABLE 2 and are as follows. The two stage PSA can handle a range of DRAM cell voltage of 0–0.4 V as logic 0, and 1–0.6 V as logic 1, 0.5 V being the mid-point. For a bitline with of 256 cells, the bitline voltage ranges between 0.8–0.88 V for logic 0 and ranges between 0.92–1 V for logic 1, 0.9 V being the mid-point voltage for the bitline. The PSA firsts stage 150 output is 0.86–0.75 V for logic 0, and 0.6–0.34 V for logic 1, and the PSA is able to correctly identify the logic 0 and 1 in these worst-case conditions. The GBL 102 voltage is 0.6 V for logic 0 and 1.1 V for logic 1. The average (nominal) gain of the first stage 150 PSA is (0.86–0.34)/(1.0–0.8)=0.52/0.2=2.6, and a best gain=(0.75–0.55)/(0.92–0.88)=0.2/0.04=5. The average (nominal) and best case gain for the two stages 150 and 160 together is 3 and 12.5 respectively.

Figure 1A:
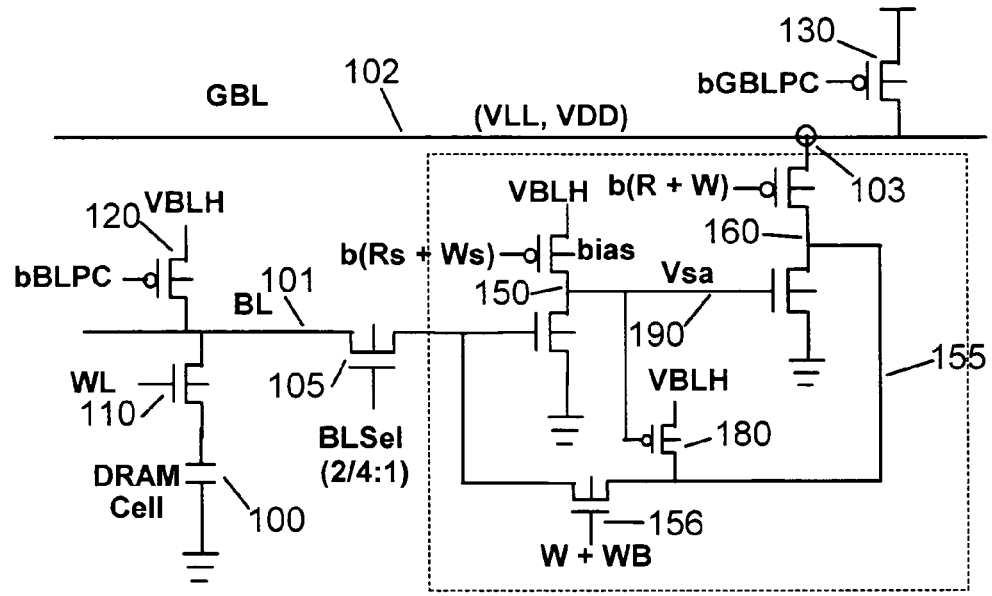
FIG. 1 shows exemplary embodiments of DRAM primary sense amplifiers with data storage and data write-back capability, and two amplification stages.
Figure 1B:
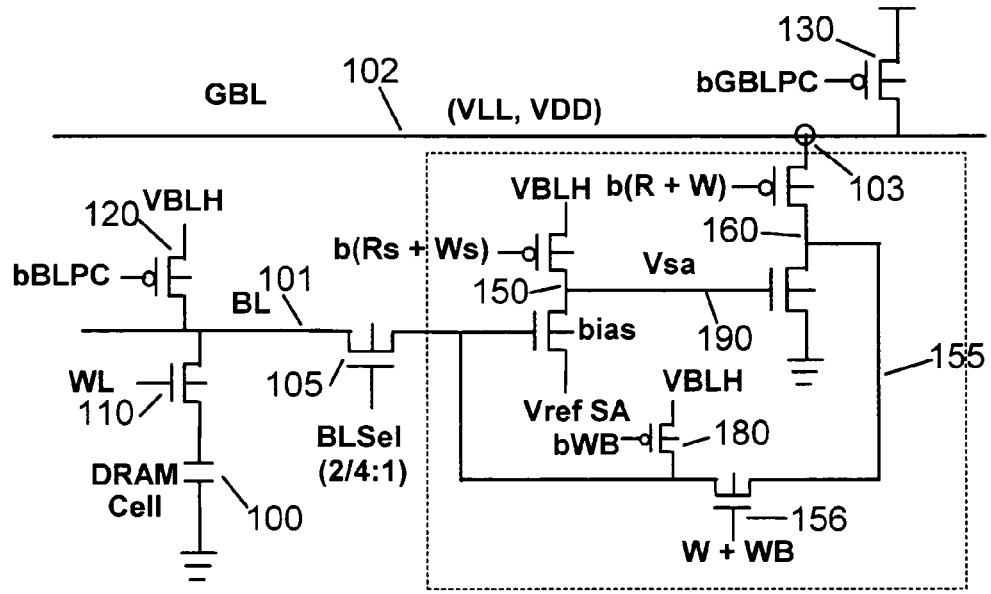

For the PSA embodiments of FIG. 1A and FIG. 1B a small PFET 180 is connected to The feedback path 155. The feedback path 155 itself is opened up by passtransistor 156 during Write or WriteBack operations. FIG. 1B shows device 180 controlled by the signal bWB and it is used to hold the feedback path high (VBLH). It may not be needed if the source 170 of the first stage 150 NFET, Vref SA is at GND since then the feedback line can hold up as there is negligible leakage from the second stage 160 NFET during the WriteBack cycle. For a slight variant which is functionally equivalent to the PSA shown in FIG. 1B, in FIG. 1A the gate of the small PFET 180 is controlled by Vsa 190. The source of the first stage 150 NFET is GND in the embodiment shown in FIG. 1A.

Figure 1C:
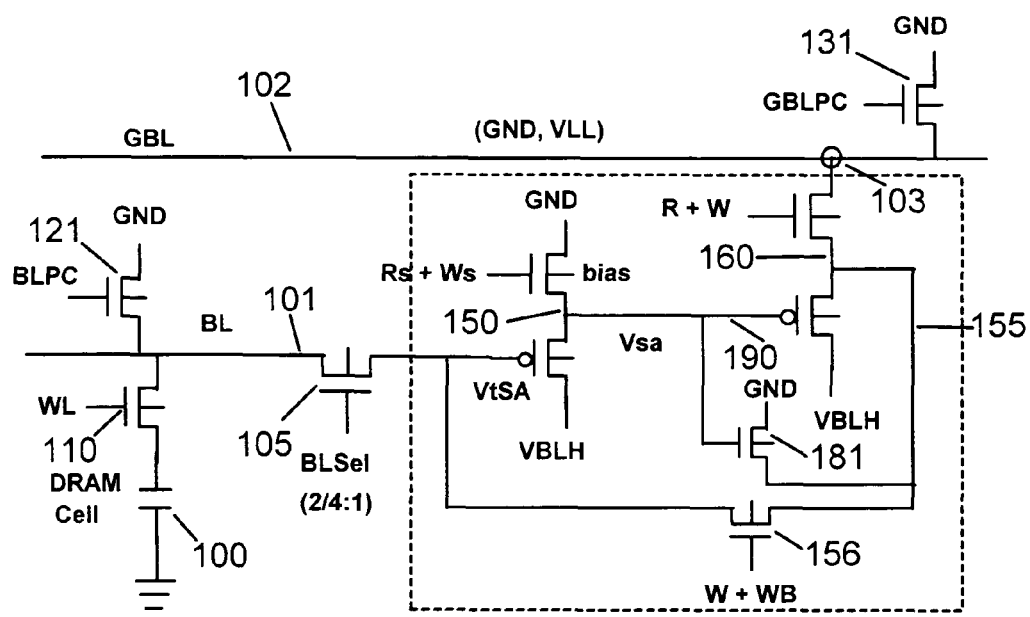

FIG. 1C shows another embodiment of the type of PSA shown on FIG. 1A, using complementary FET devices with bitline precharged voltage to GROUND ("GROUND Sensing") instead of VBLH ("VBLH Sensing"). Devices in the circuits are replaced with corresponding complementary devices (NFET with PFET, PFET with NFET), and supply and bias voltage redesigned accordingly. NFET devices 121 and 131 are precharging the bitline and the global bitline to 0 voltage, on the BLPC and GBLPC signals. In this embodiment the small device 181 connected to the feedback path 155 is an NFET with its source on GND. The gate of the small NFET 181 is controlled by Vsa 190.

FIG. 2 shows an exemplary embodiment of a DRAM primary sense amplifier with data storage and data write-back capability. This PSA has one amplification stage, circuit 150, which connects to the GBL 102 at connection 203. The source 170 of circuit 150 is at Vref SA=VLL. For this PSA a second stage 260 serves for latching, and thus serving data storage and data write-back function without amplification. Other considerations for the single stage PSA of FIG. 2, such as low voltage swing when the drain 210 of circuit 260 is tied to VBLH, and device thresholds, are as for the two stage PSA-s of FIG. 1. TABLE 3 shows voltage values of a representative embodiment of the one stage PSA with data storage and data write-back capability.

TABLE 3

| VBLH = 1 V, VDD = 1.1 V, VLL = 0.5 V | | | |
| Cell transfer ratio: BL 128 = 1/3, BL 256 = 1/5 | | | |
| | VBL | Vsa | VGBL |
| --- | --- | --- | --- |
| Read 0: | 0.8 V | 0.9 V | 0.9 V |
| Read 1: | 0.95 V | 0.5 V | 0.5 V |
| Write 0: | 0 V | 0.8 V | 1.1 V |
| Write 1: | 0.8 V | 0.3 V | 0.5 V |

VBL(read1) > Vref SA + VtSA >= VBL(read0)
Vref SA = VLL = 0.5 V, bias = 0.7 V st VtSA = 0.3 V FIG. 3 shows an exemplary embodiment of a DRAM secondary sense amplifier (SSA) with two amplification stages. The GBL 102 arriving from the PSA and being the input for the SSA, is single ended, in accordance with a single ended global bitline structure, in which a PSA and an SSA are connected by a single global bitline. The SSA has two amplification stages a first 310 and a second 320. The PFET devices are controlled by the bSSARd and bSSAPC signals. SSARd stands for SSA Read and SSAPC for SSA precharge. Latches 350 and 360 serve for data retention for Output/Input, and are controlled (set) by the DoutSet and DinSet commands respectively to capture data. The Datain 302, or Write path is opened up when the SSAWrt (SSA Write) signal goes high on the passtransistor 370. The dataout path eventually leads to the Output pins of the DRAM. The signal out on the DataOut line 301 can be either small or full swing voltage. The signal arriving on the Datain line 302 is of a small voltage swing. Other considerations for the SSA of FIG. 3, such as low voltage swing, and device thresholds, are as for the two stage PSA-s of FIG. 1.

In an exemplary embodiment of the SSA the input voltage is between VLL and VDD (e.g. 0.5 V–1.1 V) from the GBL 102, and a high Vt NFET is used in stage 310. The output of the SSA goes to a DataOut 350 latch whose input operates at 0-Vdd swing. The output of DataOut latch 350 driving the datalines 301 can be of full or half swing (for low power). The second stage output of the SSA 320 is precharged to high and the PFET (as in the circuit 160 of the PSA) is not needed. The SSA operates with the same principle as the PSA, and the gain and device width adjustment are done accordingly. A representative embodiment the various voltages in the PSA can be found in TABLE 4, and in the following discussion.

TABLE 4

| | 0 data | 1 data | del V |
| --- | --- | --- | --- |
| Input | 0.5 V– | 1.0 V | 0.5 V |
| First Stage Output | 0.2 V– | 0.8 V | 0.6 V |
| Second Stage Output | 0.0 V– | 1.1 V | 1.1 V |
| First Stage | Vt_pfet/Vt_nfet | 0.7 V/0.7 V | |
| | Wpfet/Wnfet | 900 nm/600 nm | |
| Second Stage | Vt_nfet | 0.3 V | |
| | Wnfet | 1.2 u | |

The GBL 102 is precharged to VDD (1.1 V), typically between 1.0 to 1.2 V for the current exemplary technology, by a PFET 130 as shown in FIG. 3. The GBL 102 voltage swings between 0.5V (Read 0) to VDD (Read 1) instead of full swing to reduce power and noise coupling. For the PSA shown in FIG. 1C, the precharge scheme is reversed.

Only one array in a given macro (DRAM) is active for Read or Write at each cycle. After amplifying the bitline signal of an array by a PSA, the output of the PSA is transferred via the GBL to the SSA located at the bottom edge of the DRAM macro. It detects the GBL signal and stores in a latch for data output to the dataline DataOut outside the DRAM macro. The SSA is basically a sense amplifier with output latch that can detect small swing voltage. In case for full swing voltage operation in which the GBL would swing between VDD and GND, the SSA first input stage 310 would use regular Vt NFET device. In order to detect small voltage swing between 0.5 V and VDD, the first input stage 310 uses high Vt NFET. The SSA output is precharged to high, then the GBL signal is enabled into the SSA sense amplifier by the control signal SSARd, after the GBL signal is developed. Its output is then held at the output latch 350 by setting Doutset, for output to external dataline.

With the local Write/WriteBack circuit at the PSA, the GBL 102 does not have to be full swing in order to write to the DRAM cell 100. External input data on line 302 is latched and held at a latch 360 at the SSA before the Write cycle. The input data is then written to the GBL 102 via the NFET (SSAWrt) 370. To write a 1, the GBL is at VDD (1–1.2 V) driven by the latch 360 at the secondary sense amplifier, and goes through a NFET (SSAWrt) 370 at the second sense amplifier, a PFET (b(R+W)) at the PSA second stage 160 and an NFET (W+WB) 156, again at the PSA, and then the bitline switch NFET 105 (in case PSA array multiplexing is used). The gate voltages of the pass gate NFETs 370, 156 and 105 are typically boosted above VDD+Vt (in the case of device 370) and VBLH+Vt (in the case of devices 156 and 105) to overcome Vt drop. For small swing GBL between VLL and VDD (e.g. 0.5 V–1.1 V), the pass gate 370 can be devised with a PFET without gate voltage boosting. Since the bitline 101 and GBL 102 are precharged to high, this enhances the speed of writing a 1 to the DRAM cell. The voltage Vsa on line 190 to the gate of the second stage 160 is low (0–0.2V) below threshold. To write a 0, the GBL 102 only has to swing down to about 0.6 V instead of GND, and this reduces the time to write 0, as well. Further, if the voltage Vsa to the gate of the second stage is high, it helps to keep the bitline switching to GND for writing a 0 to the DRAM cell.

The local WriteBack circuit structure at the PSA enables the global bitline 102 to be available every short cycle for Read or Write to the different banks. After a Read cycle, the WriteBack is performed at the local PSA which has been decoupled from the GBL. The global bitlines are available for Read or Write to a different bank.

In general, after decoding a command that the next cycle is a Write operation, the precharging of the bitlines and the global bitlines could be bypassed, eliminating an extra voltage swing on a large number of lines, whereby saving power.

FIG. 4 shows examples of executed operation and timing of the pipelined architecture DRAM. The curves of FIG. 4, 401 . . . 410 are lined is a time synchronized fashion, anywhere along a vertical slice of the figure we have the same time. The length of single cycle is shown by an arrow underneath the beginning of the command line 401. FIG. 4 shows the pipelined architecture of the DRAM, as is functioning in cycles and in each of the cycles an operation can be initiated, as shown by command line 401 in the example, as a RWb (Read with WriteBack), 2 Write, and 2 Read operations are launched. The execution of these operations through the DRAM involves the synchronized operations of the single ended bitline structure, of the single ended global bitline structure, of the primary sense amplifiers, and of the full-wordline I/O structure. Curve Din 402, shows the latching of input data at the DRAM Input latches. Curve ADDR 403 indicates the timing of the address generations in the DRAM's logic. Curve WL 404 shows the timing of the wordline. BankSel I and BankSel J curves 405 and 406 show the DRAM logic translating the addresses into selection specified banks, bank I and bank J, to operate onto. Curves BL I and BL J 407 and 408 show the activity of two exemplary bitlines in the selected banks I and J. The curve GBL 409 shows the operation of the global bitline serving both banks I and J. Curve Dout 410, shows the latching of output data at the DRAM Output latches/BLPC and GBLPC stand for bitline and global bitline precharge. The numbers nest to operation letters, for instance the "2" in "W2", refer to the sequence of the operations, in this case meaning the second Write operation. The figure shows how the DRAM with its pipeline is capable to a throughput which is to execute an operations in every cycle. The number of cycles that each different operation takes can vary by the operation, and an also by the sequence of operations.

FIG. 4 shows the timing sequences of the single cycle Read/Write/WriteBack pipeline of the DRAM. The DRAM operates under a single clock cycle for each Read/Write/WriteBack pipeline operation. First a Read, or Write, or ReadWriteBack command, an address and data (if a Write) are issued to the DRAM input registers, and are decoded for wordline activation, and Read/Write controls. For Write operation, the data is then latched into the SSA. This is the first cycle of the pipeline.

In the second cycle, for Write operation, wordline is activated, data is written to the GBL, then bitline and then DRAM cell. For Read operation, wordline is activated, data is read from DRAM cell, to bitline and to GBL and is then latched into the SSA, which is then available for output (during the next cycle).

Every cycle, data, command, and address can be issued to the DRAM input registers and decoded, data can be written to the SSA input latch.

Every cycle, data can be written to the GBL (from the SSA latch), bitline and then the DRAM cell with wordline activated every cycle. It is also possible to devise even shorter cycle pipeline that further subdivide the cycle into two separate cycles, one for The writing of the data to the GBL (from the SSA latch) and then to the PSA latch, and one for the writing of the data to the DRAM cell from the PSA latch via the bitline.

Every cycle, DRAM cell data can be read to the bitline, then the GBL and to the SSA latch. It is also possible to devise even shorter cycle pipeline that further subdivide the cycle into two separate cycles, one for the reading of the DRAM cell data via the bitline into the PSA latch, and one for the writing of the data to the GBL (from the PSA latch) and then to the SSA latch.

Every cycle, SSA latch can output the data of a Read operation.

Every cycle, for a ReadWriteBack operation, the bitline is not reset and the wordline is activated for one more cycle, the data in the previous Read cycle is written back to the DRAM cell. The GBL is free during this cycle for Read/Write operation to the other arrays (banks). The bitline may or may not be reset, since the node Vsa already holds the last read state. But without resetting the bitline would save some power and avoiding the extra bitline swing due to resetting.

FIG. 4 shows a sequence of five operations RWb, W, W, R (Read without WriteBack), R in five successive cycles. It shows two banks I and J operating in the Read, Write and WriteBack in successive cycles. Also while one bank is performing WriteBack, another bank is doing a Write operation. The arrows show the internal sequence of the operation inside the macro. The command and address are decoded into corresponding SSA Read/Write control, and wordline, bank select and bitline, Read/Write/WriteBack control signal. The GBL is shown that it can be busy every cycle for single cycle Read/Write at different banks. For Read operation, the data is ready for output with a latency of two cycle after command and address.

A bank can perform a Read/Write/WriteBack every cycle. Data can be Read/Write from/to the I/O every cycle. The Read latency is 2 cycle. The following table summaries the different modes of operations for single cycle R/W/Wb pipeline: Write, Read, Read with WriteBack (normal Read), Read without WriteBack (destructive Read), Read modify Write.

TABLE 5

Different modes of operations for single cycle R/W/Wb pipeline

Bank random access:

| | |
|---|---|
| R or W | single cycle using same bank or different bank |
| RWb (Rw/Wb) | single cycle using different bank, 2 cycle using same bank |

Option for successive W or R (w/o Wb), Rn (R with Wb), or R modify W

| | | |
|---|---|---|
| R (R w/o Wb) | 1 cycle | ready next cycle, same or different bank |
| W | 1 cycle | ready next cycle, same or different bank |
| Rn (R w/Wb) | 2 cycles same bank | ready next cycle, different bank, option no BL reset |
| RW (R modify W) | 2 cycles same bank | keep same WL |
| Read latency: | 2 cycles | |

Cycle time in an exemplary technology of today is around 3.3 ns.

Figure 5A:
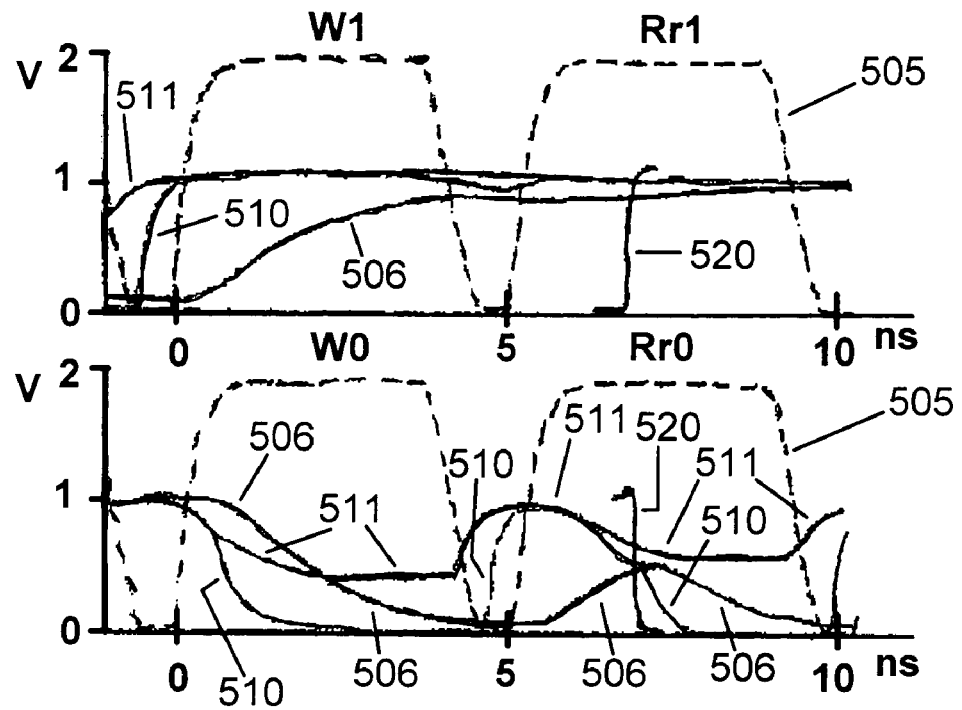

FIG. 5 shows waveform examples on various nodes of the pipelined architecture DRAM. Curve 505 is the wordline, whose up/down swing indicates the cycle time. The times in ns and the voltages are exemplary values in one of today's technologies. Curve 506 shows the voltage on the memory cell, curve 510 is the bitline, and 511 the global bitline. Curves 520 show the appropriate edge of an output pulse latching. The swings of the GBL 511 clearly show the low voltage swing operation, the line swinging between VBLH and VLL. FIG. 5A shows Write 1 and Write 0 operations, followed by Read/WriteBack 1 and ReadWriteBack 0.

The two cycle R w/Wb can be combined into a single cycle, as well as a single cycle Write, as shown in FIG. 5A. The cycle time in this version would be longer than the former version (two cycle R w/Wb) but shorter than the sum of two cycles. Its R/W/Wb pipeline cycle is longer, but overall cycle time for R w/Wb is shorter.

TABLE 6

Different modes of operations for single cycle RWb/W pipeline

| | |
|---|---|
| Random R, W | single cycle any bank |
| RWb (R w/Wb) | single cycle any bank |
| Read latency: | 2 cycles |

Cycle time in an exemplary technology of today about 5 ns.

In this mode of operation, there are only two different kinds of cycle, the Write cycle and the Read_and_WriteBack cycle. The Write operation is the same as the single cycle R/W/Wb version. In the Read_and_WriteBack operation, after a Read operation, the wordline is not reset until the data is written back from the PSA to the DRAM cell. The WriteBack control WB is enabled as in the single cycle R/W/Wb operation at the end of the Read, or slightly advanced if the Vsa is well developed in order to shorten the cycle time. The two cycle operation of Read and WriteBack is combined into one.

Figure 5B:
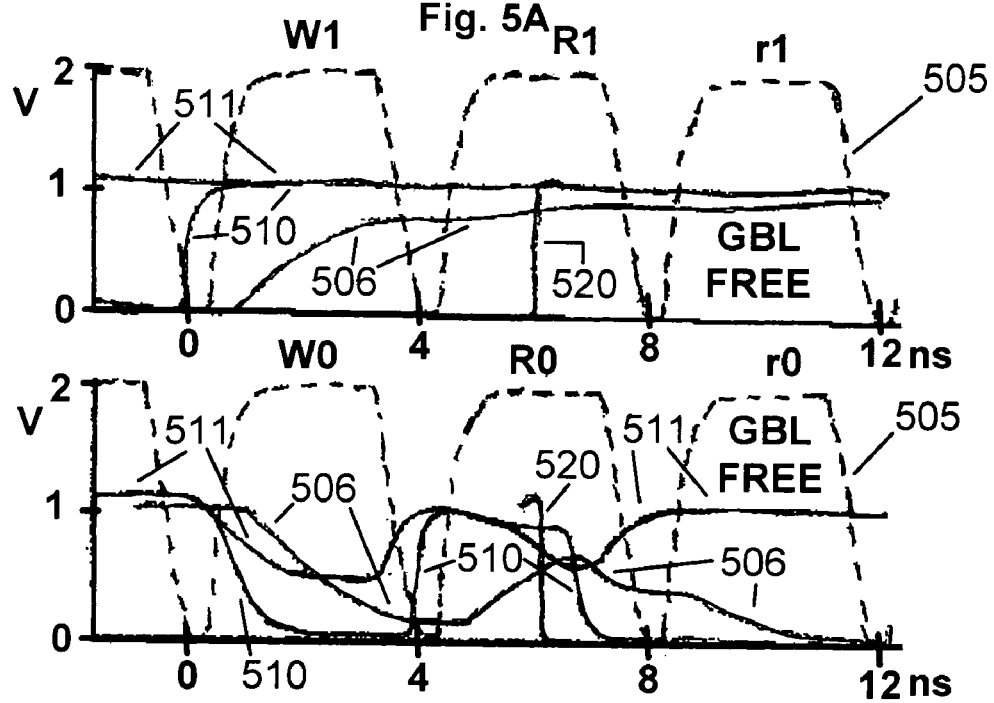

FIG. 5B shows when a Read command and a WriteBack command of are executed in differing cycles. This figure a Write 1 followed by a Read 1 and a WriteBack 1 in the third cycle, and Write 0 followed by a Read 0 and a WriteBack 0 in the third cycle. In this set up during the third cycle, during the WriteBack operation, the GBL is free to access other memory banks. The cycle time in FIG. 5B is shorter, is the same exemplary technology of today as FIG. 5A is 4 ns.

The same DRAM can operate in both modes—dual mode operation, by setting the appropriate control signal timing.

The exemplary simulation configuration of FIG. 5 is 512 WL, 256 BL, 1024 BL-pair array, VBLH=1V, VDD 1.1 V, VWL=2 V, 1 pF 2K Ohm GBL, VrefSA=0.V, VthSA=high voltage threshold.

The DRAM architecture incorporates a full-wordline I/O structure. When all the bits in a wordline are Read/Write operated on simultaneously, the result is an ultra wide I/O, ultra high bandwidth, the so called full-wordline I/O structure. Such a structure meshes with the single ended global bitline structure, otherwise the width of the data-bus would be limited by the metal wire pitch availability in laying out the data-lines in the DRAM macro. Reading or Writing to essentially all memory cells which are attached to the same wordline means that no significant subsets of cells are left out of the operation, such as operating simultaneously only, for instance, on every second memory cell attached to the wordline. Operating simultaneously typically means operating in a single cycle. Essentially all memory cells attached to the same wordline generally means all cells, except that as one skilled in the art would recognize, sometimes there may be a small number of redundant cells attached to any given wordline, serving a variety of purposes, such as redundancy cells to repair defective cells due to manufacturing imperfection, or additional cells used for error detection and correction, other than information storing.

Having a full-wordline I/O structure has advantages beyond wide I/O capability. If essentially all the cells on same wordline are operated on at once it means one does not need a column address in specifying an operation. The column address being the one which in conventional architectures gives the location of the cell to be operated on along a given wordline. The full-wordline I/O structure allows for a reduced address space, in which there is no column address. This eliminates logic for column address decoding and control lines, and further reduces silicon area. The full-wordline I/O structure requires the smallest amount of power to read the same amount of bits, otherwise more macros, if not in full-wordline I/O structure, would be required to read out the same amount of data per addressing of the memory system. As a result, more power roughly equal to N times more power would be required, where N is the number of additional macros needed to deliver the same number of bits as the full-wordline I/O macro. This fact also has implications on the ability to build the DRAM in a modular fashion.

FIG. 6. shows exemplary embodiments of various modular DRAM size increases. Since in the single ended global bitline structure the GBL runs over the banks linearly for all the banks, it is possible for each DRAM array (same as bank) to be placed in a linear (vertical) direction on top of each other, whereby increasing banking within a macro.

Multiple macros each with a number of banks (arrays) and I/O's can be combined to increase the number of banks and/or the number of I/O's. For examples, N macros each with B banks will create a memory structure with N×B banks, keeping the same number of I/O. A bank is an addressable unit whose wordlines cannot be addressed at the same time. In the current pipeline architecture, as described earlier, two different banks can be addressed and perform different kinds of Read/Write/WriteBack/Refresh operations simultaneously, to improve memory throughput and access availability. Hence more number of banks improve memory performance. A macro has a certain number of I/O. Two or more macros can be combined to increase the number of I/O. For example, N macros each with B banks and Z bits of I/O's can be combined to create a memory structure with N×Z I/O's, keeping the same number of banks B the same. Further, two or more macros can be combined to increase both the number of banks and the number of I/O. The resulting number of banks Bn and number of I/O's Zn are given by Bn×Zn=N×B×Z.

In order to increase the I/O width to more than that can be designed using a single macro, one can combine two or more macros. The macros are combined in a way that a set of corresponding arrays (in different macros) are activated simultaneously and the same corresponding wordline in them are ON simultaneously, so that their I/O can be combined to increase in I/O width. A bank now would span more than one array (in different macros).

Figure 6A:
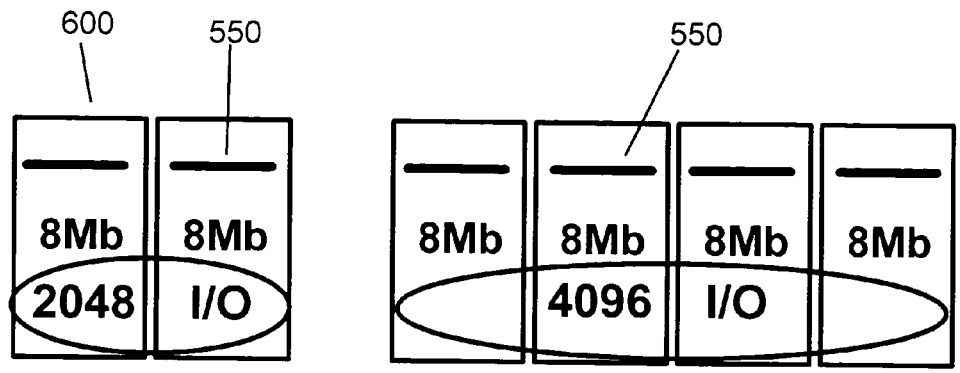

FIG. 6 illustrates these DRAM multi-macro extension techniques, by starting out with from two typical macros an 8 Mb one 600 and a 16 Mb one 610. FIG. 6A illustrates the modular increase of I/O size. Illustrative macro 600 had 8 Mb total cells, 1024 I/O in 16 banks. The line 550 illustrates the position of wordlines which are in the position (same row address) in each macro and in a given cycle perform the same operation which can be either Read or Write. When corresponding wordlines are activated simultaneously in two of the original macros one increased the I/O size to 2048, with the new macro having 16 Mb of storage and the 16 banks now spanning over two of the original macros. When sufficient drive capability exists one can further increase th I/O, for instance, by activating corresponding wordlines simultaneously in four of the original macros, and thereby increasing the I/O size to 4096, with a total storage of 32 Mb and still maintain 16 banks.

Figure 6B:
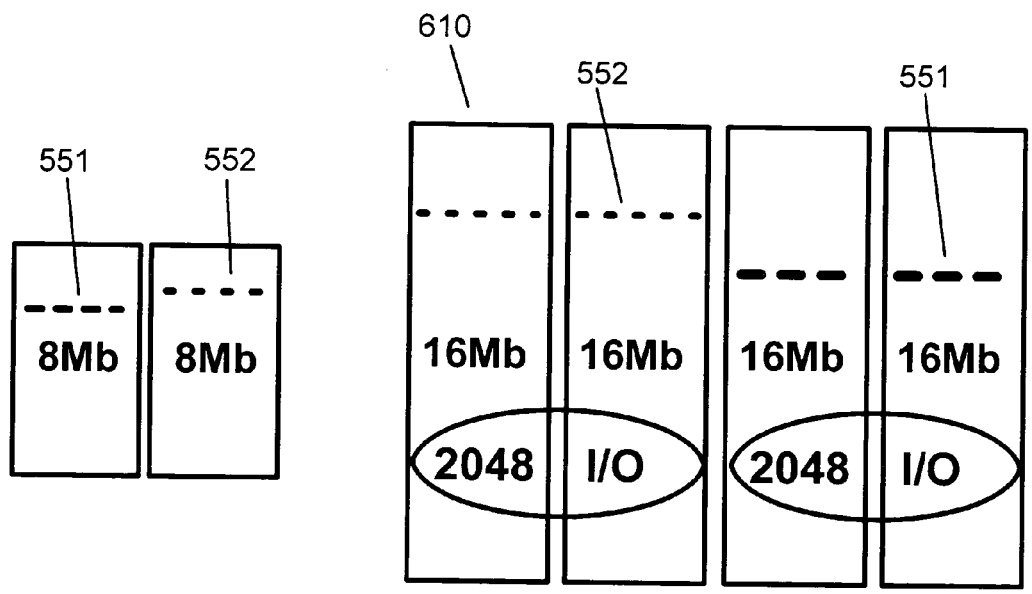

FIG. 6B illustrates DRAM when a modular manner increase involves banking size. The dashed line 551 and dashed line 552 illustrate wordlines in different positions (different row addresses) in each macro and in a given cycle performing differing operation, that each can be Read or Write, but not the same. With this increase the single ended global bitline lengthens, driven by the PSA. If the PSA has two amplification stages a desired result is in its ability to drive long global bitlines. the left side of FIG. 6B shows the same two 8 Mb array as a building blocks, now arranged into 16 Mb total storage, with the original 1024 I/O but containing 32 banks.

The right side of FIG. 6B shows that when besides involving banking size increase one also increases I/O size. This is two dimensional modular expansion, the banking increased by staking arrays on top of each other along a lengthening GBL, while the I/O increase goes in the wordline direction, which is orthogonal to the GBL. This case is illustrated by starting with 16 Mb blocks 610, each with 1024 I/O and 32 banks. Now the differing wordlines 551 and 552 span two macro each, which two macros use common global bitlines. The result is 64 Mb storage with two sets of 2048 I/O-s and having 64 banks. Such simple increase of I/O is only made possible because of the reduced address space with no column address.

The macro is growable by stacking array in one direction (vertically) to increase the total size and number of banks for access. The PFET of the PSA second stage driver is resized according to the length of the GBL (larger width for longer GBL for larger macro with more arrays). The maximum number of arrays can be put in a macro depends on the performance limit set due to GBL RC delay and chip size. E.g. for a current exemplary technology, the macro is growable at increment of 512 Kb or 576 Kb with error correction bits (ECC) bits.

For instance:
  –9 Mb macro, 576 Kb array w/512 WL and 1152 BLP, 1152 I/O, 16 banks, 1.12 mm×4.00 mm=4.47 mm2 (8 SF 0.18 um technology)
  –18 Mb macro, 576 Kb array w/512 WL and 1152 BLP, 1152 I/O, 32 banks, 1.12 mm×8.22 mm=9.18 mm2 (8 SF 0.18 um technology)

The macro can be growable two-dimensionally in the wordline direction, number of BL pairs (BLP) which also affects the width of the I/O. For the current technology, the wordline length is 1024 BLP (or 1152 BLP with ECC bits). For shorter I/O width, one can resize the macro to shorter wordline, or increase the wordline for wider I/O to within the performance limit set forth due to the wordline delay.

The DRAM structure can be made growable using two or more macros, to increase overall total DRAM size, or to increase overall I/O wide, and/or to increase the total number of banks.

If the input data and output data buses are available separately, one bank in one macro can perform Read operation, while another bank in a different macro can perform a Write operation. This is the single cycle simultaneous Read/Write operation at two different banks in two different macros. Read/Write cannot be done in a single macro at the same cycle because a GBL cannot be shared for Read/Write simultaneously. WriteBack and Read/Write can be done in the same cycle in the same macro using this architecture since WriteBack is localized and does not involve GBL.

When two or more macros are combined to increase the I/O width and to increase the number of banks as shown in FIG. 6B, the macros are partitioned into a set of macro groups such that each group has the same number of macros and each group has their I/O width increased. For instance, eight 8 Mb macros with 1024 I/O width, 16 banks can be grouped into 4 sets of macro groups, each having two macros, so each group has an I/O width of 2048 and 16 banks, and the resulting DRAM structure has a total of 64 Mb with 2048 I/O width and 64 banks.

After the combined grouping for I/O and banking, each banks span two or more macros with wider I/O, as illustrated in FIG. 6B. As long as there are other banks available in non-overlapping macros, simultaneous Read/Write operations can be performed at different banks in the same cycle.

FIG. 7 shows an exemplary floorplan of a two dimensional growable structure by combining macros to form a bigger DRAM, with shared input, output, command and address buses running in orthogonal direction to the macros. The command, address and data can be distributed to the macros, and data returned to the overall I/O with minimum skew. The floorplan is growable two dimensionally, vertically within a macro in term of the number of arrays and horizontally the number of macros, as long as chip size constraint is not violated. The overall structure can be used to increase overall I/O width and/or to increase number of banks. The overall structure can perform simultaneous Read 720, Write 710 and/WriteBack in the same cycle at different banks located in non-overlapping macros. WriteBack and Read/Write can be performed in the same macro within the same cycle, since GBL is not involved for WriteBack by the PSA in this architecture. This illustration in FIG. 7 shows a total of 8 macros each of 8 Mb for a total of 64 Mb, with 1024 I/O and 128 banks. In an exemplary technology of today it has a 3.3 ns cycle time. Each of the 8 macros is composed of 16 512 kb arrays with 512 WL, 1024 BLP and 1024 GBL.

The arrays are made up of DRAM cells arranged in rows each of which is controlled by a wordline driver, there are same number of wordlines as number of rows. In the orthogonal column direction, there are a number of bitlines each of which connected to a number of DRAM cells, which are placed in a column and each is controlled by the corresponding wordline through a FET device. When the cell is selected by a wordline via the control FET device, the cell voltage (0 or 1) develops a signal on the bitline and is detected by the PSA located at the end of the bitline. One single ended bitline is used to detect the signal by the PSA. The one bitline scheme is a new approach that enables Read/Write of bits on entire wordline to the external I/O: the full-wordline I/O structure.

The PSA is placed at the bottom end of an array. The PSA input is connected to the end of a bitline. There are same number of PSA as the number of cells controlled by a wordline. For efficient cell layout in an array as shown in FIG. 7, the cells are arranged such that alternating columns of cells and alternating bitlines are active. Two adjacent bitlines (odd and even) form a bitline pair, and only one is active and the other is inactive held at a fixed voltage (e.g. VBLH), and it can serve for noise shielding. For instance, each wordline controls 1024 cells, there are 2048 columns of cells and bitlines, and 1024 PSA each connected to one of the two bitlines via a FET multiplexer (as shown for instance in FIG. 1). On the lateral left and right end of the array, there are wordline drivers each of which activates the wordline and open the corresponding DRAM gates when the corresponding row address is selected.

In addition to having one row of PSA for each array, for more efficient use of area, each row of PSA can be arranged in a way that each PSA serves two adjacent arrays (top and bottom) by multiplexing. The input of a PSA connects the two bitlines of the top array and also to the two bitlines of the bottom array via FET multiplexers (bitline switch). Only 1 out of these 4 bitlines are active, depends on which of the top or bottom arrays, and which set of the odd or even bitlines are selected.

A row of second sense amplifiers (SSA), described earlier in FIG. 2, is located at the bottom of each macro. Each SSA is communicated to the corresponding bit of a PSA of each array via the global bitline (GBL) for data input to and output from the DRAM cells.

The SSA of each macro is connected to the memory system input and output data buses which communicate with all the macros via their SSA. The memory system input and output data buses go to the data input and output latches of the entire memory system. At each cycle, the bits correspond to the addressed, one or two entire wordlines can be read or written simultaneously via these memory system data buses to the corresponding banks of one or two macros. The data are pipelined from the memory system data input and/or output registers, through the data buses, SSA, GBL, PSA, bitlines, to the DRAM cells of the corresponding, entire wordlines; as well as the address and command from the memory system address and command registers to the address and command decode unit of the individual macros via the address and command buses. In other exemplary embodiments one can expand on the single cycle single Read and single Write pipeline and implement a multiple Read and a multiple Write in a single cycle pipeline, with multiple read and multiple write buses.

The described DRAM is especially useful as an embedded DRAM (EDRAM) macro. Such macros comprise part of the processor chips and speed and bandwidth (large I/O capability) is especially of high premium.

Many modifications and variations of the present invention are possible in light of the above teachings, and could be apparent for those skilled in the art. The scope of the invention is defined by the appended claims.

We claim:

1. A DRAM, comprising:
at least one primary sense amplifier, wherein the at least one primary sense amplifier has at least two amplification stages, has single ended sensing, has data storage and data write-back capability, wherein the write-back comprises at least one passtransistor;
a plurality of storage cells and a plurality of bitlines, with a single ended bitline structure, wherein one storage cell of the plurality of storage cells and the at least one primary sense amplifier are connected by one single bitline of the plurality of bitlines; and
a plurality of secondary sense amplifiers and a plurality of global bitlines, with a single ended global bitline structure, wherein the at least one primary sense amplifier and one secondary sense amplifier of the plurality of secondary sense amplifiers are connected by one single global bitline of the plurality of global bitlines.

2. The DRAM of claim 1, wherein the DRAM further comprises a small voltage swing design.

3. The DRAM of claim 1, wherein at least one of the plurality of secondary sense amplifiers comprise at least two amplification stages.

4. The DRAM of claim 1, wherein the at least one primary sense amplifier is being capable to decouple from the one single global bitline.

5. The DRAM of claim 1, wherein the at least one primary sense amplifier comprises MOS devices, and wherein at least one of the MOS devices has a customized threshold.

6. The DRAM of claim 5, wherein the customized threshold is dynamically adjusted.

7. The DRAM of claim 1, wherein the DRAM is an embedded DRAM.

8. The DRAM of claim 1, wherein the at least one primary sense amplifier further comprises a write capability from the one single global bitline to the one storage cell, wherein the write comprises the at least one passtransistor.

* * * * *